(12) United States Patent
Gilchrist et al.

(10) Patent No.: US 7,925,378 B2
(45) Date of Patent: Apr. 12, 2011

(54) PROCESS APPARATUS WITH ON-THE-FLY WORKPIECE CENTERING

(75) Inventors: Ulysses Gilchrist, Reading, MA (US);
Haniel Olivera, Fitchburg, MA (US);
William Fosnight, Carlisle, MA (US);
Richard Pickreign, Harvard, MA (US);
Robert Caveney, Windham, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 63 days.

(21) Appl. No.: 11/485,144

(22) Filed: Jul. 11, 2006

(65) Prior Publication Data

US 2007/0071581 A1    Mar. 29, 2007

Related U.S. Application Data

(60) Provisional application No. 60/698,536, filed on Jul. 11, 2005.

(51) Int. Cl.
*G06F 7/00* (2006.01)
(52) U.S. Cl. .................................. 700/218; 414/222.02
(58) Field of Classification Search .................. 700/213, 700/218, 114, 121, 192, 193; 414/222.02, 414/222.04, 936
See application file for complete search history.

(56) References Cited

U.S. PATENT DOCUMENTS

| | | | |
|---|---|---|---|
| 6,013,920 A | 1/2000 | Gordon et al. ........... 250/559.36 |
| 6,158,946 A | 12/2000 | Miyashita ...................... 414/411 |
| 6,198,976 B1 * | 3/2001 | Sundar et al. ................... 700/59 |
| 6,347,291 B1 * | 2/2002 | Berman ........................ 702/150 |
| 6,382,896 B1 | 5/2002 | Hu et al. ....................... 414/217 |
| 6,390,897 B1 | 5/2002 | Gonzalez-Martin et al. ... 451/67 |
| 6,533,521 B1 | 3/2003 | Todorov et al. ............ 414/217.1 |
| 6,742,980 B2 * | 6/2004 | Sasaki ........................... 414/783 |
| 7,112,027 B2 | 9/2006 | Nagata ........................... 414/411 |
| 2002/0026259 A1 * | 2/2002 | Hirata et al. .................. 700/114 |
| 2003/0130761 A1 * | 7/2003 | Schauer ........................ 700/213 |
| 2004/0235033 A1 * | 11/2004 | Zaffaroni et al. ................. 435/6 |
| 2005/0203664 A1 * | 9/2005 | Schauer et al. ............... 700/213 |
| 2006/0055904 A1 * | 3/2006 | Baselmans ...................... 355/55 |

* cited by examiner

*Primary Examiner* — Gene Crawford
*Assistant Examiner* — Ramya Prakasam
(74) *Attorney, Agent, or Firm* — Perman & Green, LLP; Richard Pickreign (57) ABSTRACT

A substrate processing apparatus having a transport apparatus, at least one sensor connected to the transport apparatus and a controller. The transport apparatus is adapted for transporting the substrate between processing stations of the processing apparatus. The sensor is capable of sensing the substrate transported by the transporting apparatus. The sensor is arranged for sending at least one signal in response to sensing the substrate. The controller is communicably connected to the sensor and arranged to determine alignment of the substrate in at least two directions, angled relative to each other, relative to a predetermined location. The controller is capable of determining alignment from the at least one signal identifying no more than two points on the substrate and independent of radial variances between substrates.

10 Claims, 6 Drawing Sheets

FINDING SENSOR POSITION
(FOR CENTERED WAFER)
FIG.4

FINDING SENSOR POSITION
(NON CENTERED WAFER)

PROCESS APPARATUS WITH ON-THE-FLY WORKPIECE CENTERING

CROSS-REFERENCE TO RELATED APPLICATION(S)

This application claims the benefit of U.S. Provisional Application No. 60/698,536, filed Jul. 11, 2005, which is incorporated by reference herein in its entirety.

BACKGROUND

1. Field of the Exemplary Embodiments

The exemplary embodiments disclosed herein relate to a substrate processing apparatus and, more particularly, to a substrate processing apparatus with on-the-fly substrate centering.

2. Brief Description of Related Developments

Typical manufacturing processes for semiconductor integrated circuits may utilize robotic manipulators to cycle substrates, for example, circular silicon wafers, through predetermined sequences of operations in fully automated processing equipment. Substrates may be delivered to the substrate processing equipment, also referred to as a tool, in standard transportation cassettes which house a batch of substrates stored in horizontal slots. Individual substrates may then be transferred from the cassettes by a specialized pick-place robot which may be integrated into the tool. Typically, the robot holds a substrate by means of frictional force between the backside of the substrate and an end-effector. In some applications, the force may be supplemented by a controlled suction-cup gripper.

As a result of limited, but not negligible, motion of the substrates in the cassettes during transportation, the robot may pick the substrate with undesirable eccentricity or misalignment. The difference between the actual location of the center of the substrate and the specified position on the robot end-effector needs to be corrected before the substrate can be processed in the tool. Conventional methods and devices for determination and correction of eccentricity or misalignment of circular substrates may include stationary aligners, aligners built into the robot end effector, and external sensors.

When utilizing a stationary aligner, a robot places the substrate on a chuck of a stationary rotating device which rotates the substrate while scanning its edge for a fiducial location and substrate eccentricity for example. The aligner may then move the substrate to a centered position, or transmit the resulting eccentricity vector to the robot which utilizes this information to pick the substrate in a centered manner. Though this approach may be satisfactory initially, subsequent pics and placements of the substrate, such as may occur with multi step process tools where substrates may be transported serially between multiple process steps, may result in the location of the substrate shifting relative to its desired location in the various stations. This is also known as the substrate walking. In conventional systems, recentering the substrate, such as for example due to undesired walking (though post alignment shifting of the substrate may occur for other reasons), may be performed by returning the substrate to the aligner. This approach introduces undesirable delays associated with the additional pick-place operations and with the additional and redundant edge-scanning process, all of which are executed sequentially rather than in an on-the-fly manner.

In other conventional systems, the transport apparatus or robot may have sensors resident thereon capable of detecting eccentricities of the substrates when picked; thus allowing recentering during placement. For example, an aligner may be integrated into the robot end-effector that mechanically centers the substrate and then scans its edge for fiducial location. The aligning process may take place on the fly during a regular substrate transfer operation, which can improve throughput performance. However, the mass and complexity of the moving components of the robot arm increases undesirably, which results in limited speed, compromised reliability and a higher cost.

Determination of substrate eccentricity using external sensors generally includes moving the substrate through a set of sensors which detect the leading and trailing edges of the substrate. The resulting information is processed to determine the actual location of the center of the substrate. The alignment process takes place on the fly during regular substrate transfer operations without increasing the mass or complexity of the robot arm. One example of the use of sensors for determining substrate eccentricity is disclosed by U.S. Pat. No. 5,706,201, issued on Jan. 6, 1998 to J. Randolph Andrews, entitled Software to Determine the Position of the Center of a Wafer. However, one disadvantage of this method is that it requires an array of multiple sensors. Another example of a conventional substrate positioning system is disclosed in U.S. Pat. No. 5,563,798. The disclosed conventional system may also determine position of the substrate by maintaining the position of the transport robot as the robot transports the substrate by one or more position sensors. At least two data points are measured during substrate transport to establish substrate position. The wafer position calculated by the disclosed conventional system is affected by dimensional variations of the wafers, and the conventional system is not capable of compensating for wafer variances when determining the position adjustment to correct wafer position eccentricity.

It would be advantageous to provide a system for determining eccentricity or misalignment that includes a limited number of sensors to reduce cost and also overcomes the above mentioned disadvantages and other shortcomings of conventional systems.

SUMMARY OF THE INVENTION

In accordance with one exemplary embodiment a substrate processing apparatus is provided. The processing apparatus has a transport apparatus, at least one sensor connected to the transport apparatus and a controller. The transport apparatus is adapted for transporting the substrate between processing stations of the processing apparatus. The sensor is capable of sensing the substrate transported by the transporting apparatus. The sensor is arranged for sending at least one signal in response to sensing the substrate. The controller is communicably connected to the sensor and arranged to determine alignment of the substrate in at least two directions, angled relative to each other, relative to a predetermined location. The controller is capable of determining alignment from the at least one signal identifying no more than two points on the substrate and independent of radial variances between substrates.

BRIEF DESCRIPTION OF THE DRAWINGS

The foregoing aspects and other features of the present invention are explained in the following description, taken in connection with the accompanying drawings, wherein.

DETAILED DESCRIPTION OF THE EXEMPLARY EMBODIMENT(S)

Figure 1:
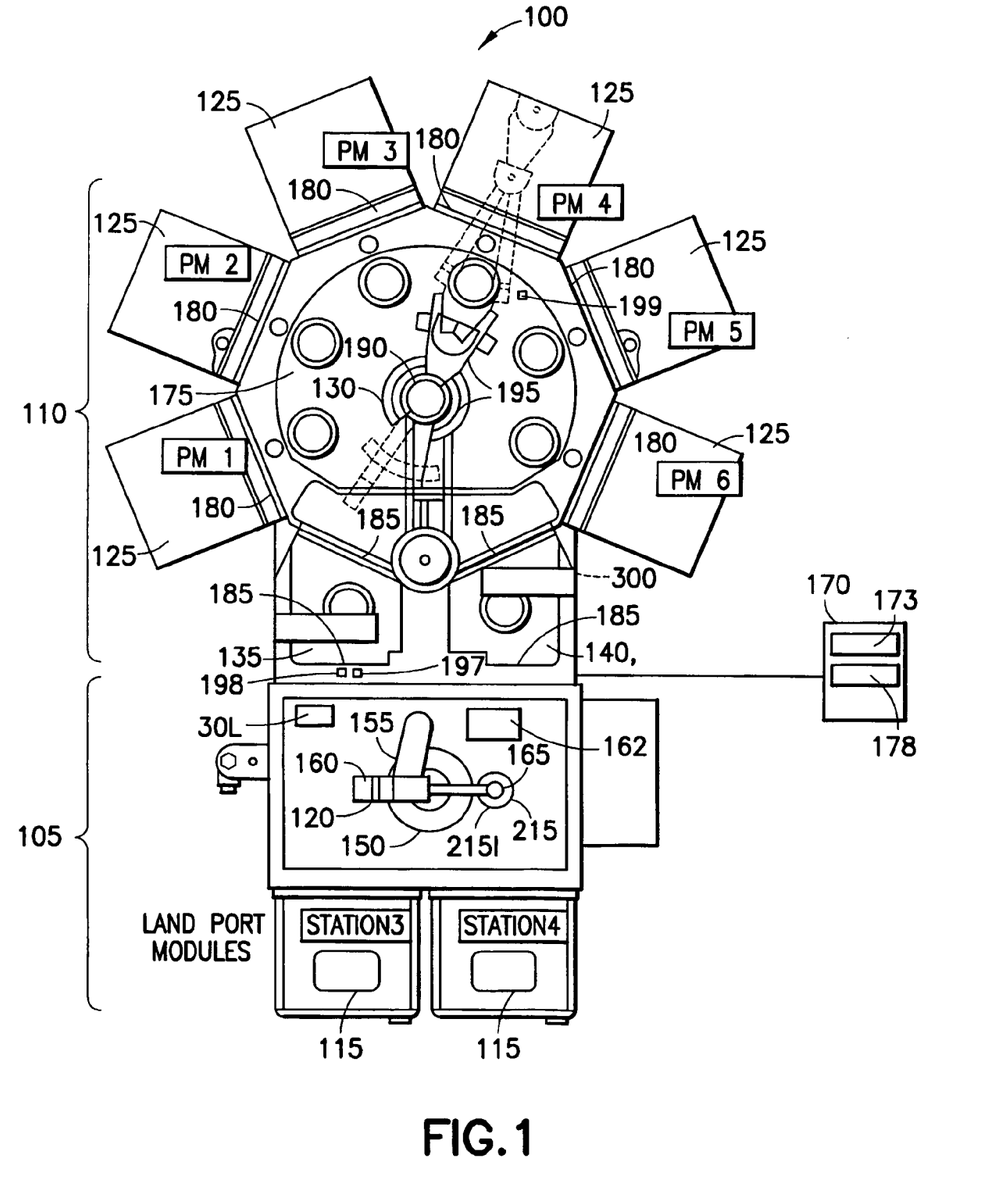
FIG. 1 is an schematic plan view of a substrate processing apparatus incorporating features in accordance with one exemplary embodiment.

Referring to FIG. 1, a perspective view of a substrate processing apparatus 100 incorporating features of the disclosed embodiments, and a substrate 215 is illustrated. Although the embodiments disclosed will be described with reference to the embodiments shown in the drawings, it should be understood that the embodiments disclosed can be embodied in many alternate forms of embodiments. In addition, any suitable size, shape or type of elements or materials could be used.

For purposes of the exemplary embodiments described herein, substrate 215 may be for example, a semiconductor wafer, such as a 200 mm, 300 mm or any other desired diameter substrate, any other type of substrate suitable for processing by substrate processing apparatus 100, a blank substrate, or an article having characteristics similar to a substrate, such as certain dimensions or a particular mass. In the exemplary embodiment, the substrate 215 may have readable indicia identification located on or otherwise tagged to the substrate. A suitable example of a substrate with identification indicia located thereon is described in U.S. patent application Ser. No. 10/465,667, filed Jun. 19, 2003, and incorporated by reference herein in its entirety. In alternate embodiments identification data and metric data for a given substrate, may be associated with the subject substrate and provided (e.g. transmitted, read) to the apparatus in any other suitable manner. The identification indicia 215I may be for example identification information for the substrate 25 (such as substrate type, lot and sequence number and any other desired identifier information). The substrate identification indicia may further include for example other desired substrate specific information, including substrate metric data such as fiducial type and location, any substrate defects, type and locations, substrate radius/diameter, and circularity data. In alternate embodiments, any other desired data or information may be provided by the substrate indicia. The substrate indicia may embody the substrate identification information and metric data in any desired manner (e.g. barcode, alphanumber code, etc.). As may be realized, allowable tolerances may result in substantial dimensional variances between individual substrates. For example, semi standards specify that for 200 mm silicon wafers, the diameter tolerance is ±0.5 mm, and for 300 mm silicon wafers the diameter tolerance is ±0.2 mm.

For purposes of the exemplary embodiments described herein, eccentricity refers to the difference between the actual location of the center of a substrate and its desired position on an end effector of a robotic manipulator or robot arm. The robot arm may compensate for the difference between the substrate center location and its desired end effector position when performing a place operation (for example in a processing station of the apparatus), resulting in the substrate being placed in a centered position regardless of the amount and direction of the initial eccentricity. In the exemplary embodiments, the processing apparatus may have one or more sensor(s) that are capable of sensing the substrate transported by the robot arm. The processing apparatus may also have a controller controlling the robot arm and communicating with the one or more sensor(s). Thus, the sensor(s) can signal the controller in response to sensing the substrate. The controller may be programmed with an automatic wafer centering (AWC) program or algorithm. The centering program is capable of determining the eccentricity or alignment of the substrate relative to a desired location from sensor signals locating but two points on the substrate, and independently of variances between substrates as will be described in greater detail below. The controller can control the robot arm to place the substrate with the known alignment in the desired location. As will also be described below, the processing apparatus 100 may include an apparatus or system 300 for identifying or determining variances on substrate(s), capable of affecting determination of substrate alignment, and the centering program is arranged to use the variance information to compensate for the variances when determining the substrate alignment. For example purposes, the desired alignment tolerance may be ±0.005 mm (about two orders of magnitude smaller then diametrical tolerances of substrates).

Referring still to FIG. 1, substrate processing apparatus 100 is a representative substrate processing tool, shown as having a general batch processing tool configuration. In alternate embodiments, the substrate apparatus may be of any desired type such as sorter, stocker, metrology tool, etc. In this embodiment, apparatus 100 may generally have an atmospheric section 105, for example forming a mini-environment and an adjoining atmospherically isolatable section 110, which for example may be equipped to function as a vacuum chamber. In alternate embodiments, the atmosphere isolated section may hold an inert gas (e.g. $N_2$) or any other isolated atmosphere.

In the exemplary embodiment, atmospheric section 105 typically has one or more substrate holding cassettes 115, and an atmospheric robot arm 120. The atmospheric section 105 may also have an aligner 162 located therein. In the exemplary embodiment, the section 105 may also have a suitable reader 302 for reading identification indicia 215I on the substrate(s). Section 110 may have one or more processing modules 125, and a vacuum robot arm 130. The processing modules 125 may be of any type such as material deposition, etching, baking, polishing, ion implantation cleaning, etc. As may be realized the position of each module, with respect to a desired reference frame, such as the robot reference frame, may be registered with controller 170. Also, one or more of the modules may process the substrate(s) 195 with the substrate in a desired orientation, established for example using the fiducial (not shown) on the substrate. Desired orientation for substrate(s) in processing modules may also be registered in the controller 170. Vacuum section 110 may also have one or more intermediate chambers, referred to as load locks. The embodiment shown in FIG. 1 has two load locks, load lock A 135, and load lock B 140. Load locks A and B operate as interfaces, allowing substrates to pass between atmospheric section 105 and vacuum section 110 without violating the integrity of any vacuum that may be present in vacuum section 110. Substrate processing apparatus 100 generally includes a controller 170 that controls the operation of substrate processing apparatus 100. Controller 170 has a processor and a memory 178. In addition to the information noted above, memory 178 may include programs including techniques for on-the-fly substrate eccentricity and misalignment detection and correction as will be described below. Memory 178 may further include processing parameters, such as temperature and/or pressure of processing modules, and other portions or stations of sections 105, 110 of the apparatus, temporal information of the substrate(s) 215 being processed and metric information for the substrates, and programs, such as algorithms, for applying this ephemeris data of apparatus and substrates to determine on the fly substrate eccentricity as will be further described below.

In the exemplary embodiment, atmospheric robot arm 120, also referred to as an ATM robot, may include a drive section 150 and one or more arms 155. At least one arm 155 may be mounted onto drive section 150. At least one arm 155 may be coupled to a wrist 160 which in turn is coupled to an end effector 165 for holding a substrate 215. End effector 165 may be rotatably coupled to wrist 160. ATM robot 120 may be adapted to transport substrates to any location within atmospheric section 105. For example, ATM robot 120 may transport substrates among substrate holding cassettes 115, load lock A 135, and load lock B 140. ATM robot 120 may also transport substrates 215 to and from the aligner 162. Drive section 150 may receive commands from controller 170 and, in response, direct radial, circumferential, elevational, compound, and other motions of ATM robot 120. Aligner 162 may be arranged to find a fiducial feature (not shown) on the substrate 215 and align the substrate accordingly, as well as establish the eccentricity of the substrate as will be described further below. The reader 302 may read the indicia 215I on the substrate and transmit the data therefrom to the controller 170 for registration of the wafer identification and metric information embodied in the indicia.

In the exemplary embodiment, vacuum robot arm 130 may be mounted in central chamber 175 of section 110 (see FIG. 1). Controller 170 may operate to cycle openings 180, 185 and coordinate the operation of vacuum robot arm 130 for transporting substrates among processing modules 125, load lock A 135, and load lock B 140. Vacuum robot arm 130 may include a drive section 190 and one or more end effectors 195. In other embodiments, ATM robot 120 and vacuum robot arm 130 may be any suitable type of transport apparatus, for example, a SCARA-type robot, an articulating arm robot, a frog leg type apparatus, or a bi-symmetric transport apparatus.

As seen in FIG. 1, in the exemplary embodiment the apparatus 100 may have a number of substrate presence detection sensors 197, 198, 199 therein used for example to effect on the fly centering of the substrate 215 carried by transport robots 120, 130. In alternate embodiments there may be more or fewer sensors, and the positions of the sensors may be as desired. Sensors 197, 198 may be positioned as shown to operate substantially as a sensor pair, and may effect on the fly substrate centering in conjunction with suitable algorithms in the controller 170 in a similar manner to that described in U.S. patent application Ser. No. 10/739,375, filed Dec. 18, 2003, incorporated by reference herein in its entirety. One sensor 199, is shown in FIG. 1 as being positioned in the vacuum chamber of the processing apparatus for example purposes. In alternate embodiments, more sensors may be located in the transport chamber of the atmosphere isolated section. The location of exemplary sensor 199 shown in FIG. 1 is merely representative. As will be described below, the apparatus 100 may also have an on the fly substrate centering system 101 capable of using but a single sensor 199 for effecting on the fly substrate centering.

Figure 2:
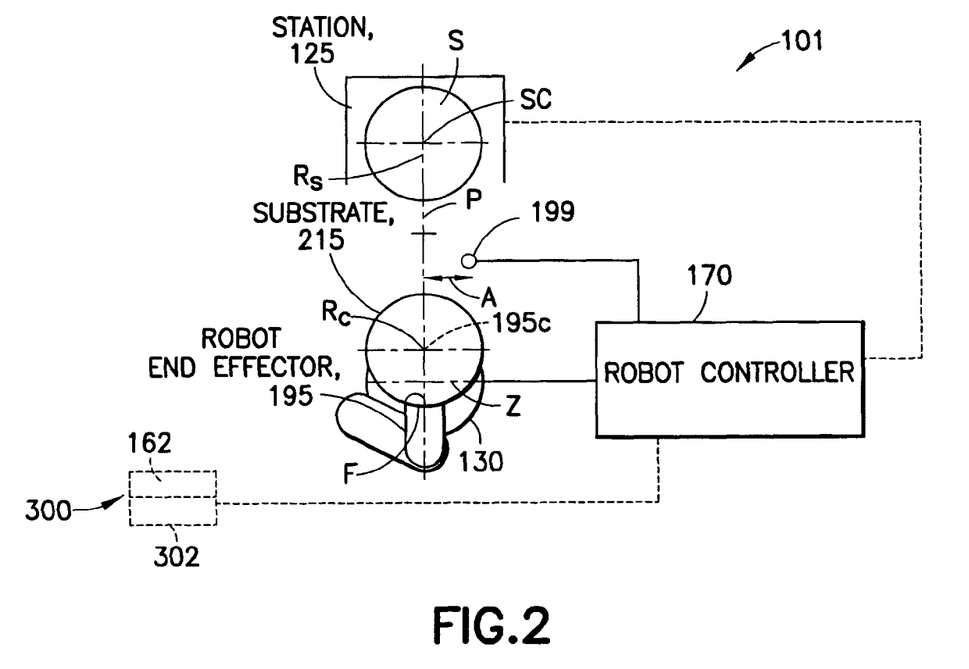
FIG. 2 is a schematic plan view of a substrate transport apparatus, substrate station, sensor and controller of the processing apparatus in FIG. 1, and of a substrate being transported to the substrate station.

Referring now to FIG. 2, there is a schematic plan view of the centering system 101 that in the exemplary embodiment may generally include transport robot 130, sensor(s) 199, robot controller 170 and system 300 for determining substrate variance. As noted before, one sensor 199 is shown in FIG. 2 for example purposes, and in alternate embodiments the centering system may have more than one sensor. FIG. 2 also shows an exemplary processing module 125 of the apparatus 100 (see FIG. 1). In FIG. 2, the transport robot 130 is rendered entirely schematically, and as noted before robot 130 may have any desired configuration. The robot 130 is shown holding a substrate 215 thereon for transport to processing module 125. The processing module 125 has a substrate station S that defines a predetermined center position SP. It is desired that the center of substrate 215, when positioned in station S, be substantially coincident with the station center SC. In alternate embodiments, the substrate station may be defined by any desired portion of the processing apparatus where a substrate may be positioned by the robot. The locations or the station S and sensor(s) 199 relative to the robot 130, shown in FIG. 2 is merely exemplary. In alternate embodiments, the substrate stations and sensor(s) may be located as desired relative to the transport robot. In FIG. 2, robot 130, sensor 199, system 300 and controller 170 are shown connected, as will be described below, to form on the fly substrate centering system 101 capable of determining the eccentricity of substrate 215, on robot end effector 195, as the robot transports the substrate along a transport path P to station S, and generating a centering factor ensuring the robot places the substrate 215 on the substrate station center SC. As seen in FIG. 2, in the exemplary embodiment system 300 may include the aligner 162 and the substrate indicia reader 302. Also the substrate processing module 125, defining substrate station S, may also be connected to the controller 170 (as shown schematically in FIG. 2) to provide on the fly substrate centering system 101 as will be described below. The controller 170 may use information or data provided by or derived from the aligner 162, reader 302 and processing module 125 to effect on the fly centering. Also, as will be described, the location of the sensor 199 with respect to the travel path may be established based on predetermined characteristics of the processing module 125.

As may be realized, robot 130 is connected to and communicates with controller 170 so that the controller may control the movements of the robot in order to bring the robot end effector 195, specifically the end effector center 195C, to any desired position in apparatus 100 in a known and controlled manner. For example robot 130 may have desired position determining devices that are connected and send suitable signals to the controller enabling the controller to define both positional coordinates and momentum defining parameters of the end effector center 195C in any desired reference system associated with the robot 130. For example, the robot 130, may be pivotally mounted, as described before, to allow whole body rotation about an axis Z and may be articulated to move the end effector center 195C at least in a radial manner relative to axis of rotation Z. The robot 130 may have motor encoders that are connected to the controller 170 to identify relative or absolute movement of the robot motors effecting movement. Further, controller 170 is programmed to convert the encoder data and (in combination with geometry information of the robot, programmed in the controller) generate the position coordinates and inertial parameters of the end effector center 195C. Thus, controller 170 knows the location coordinates (in a desired coordinate reference frame) of the end effector center 195C (identified in FIG. 2 as $R_c$) at any given time, and the location of any destination of the end effector (for example the center SC of the substrate stations).

Referring still to FIGS. 1-2, aligner 162 may be of any suitable type. In the embodiment shown, aligner 162 is located in the front or atmospheric section of the apparatus (see FIG. 1), though in alternate embodiments the aligner may be located in any desired position in the apparatus. An example of a suitable aligner is disclosed in U.S. patent application titled "High Speed Aligner Apparatus", Ser. No. 11/179,745, filed Jul. 11, 2005, incorporated by reference herein in its entirety. As noted before aligner 162 may have a suitable sensor(s), such as a through beam sensor, capable of detecting a fiducial F on the substrate 215 (see FIG. 2). As may be realized and also noted before, the fiducial F serves to identify a desired alignment of the substrate 215 related to process characteristic of one or more of the processing modules 125. For example, process module 125, shown in FIG. 2, may be capable of carrying out a given process on a substrate 215 that demands the substrate have a specific orientation. The aligner for example may position the substrate 215, when in the aligner, so that when subsequently transported and placed by robot 132 in the substrate station S, the substrate 215 has the desired orientation. In alternate embodiments, the aligner may identify position information to the controller so that the controller control the transport robot to place the substrate in process module with the desired orientation. The orientation of the substrate established by aligner 162, positions the fiducial F of the substrate in a known position. The known position of the fiducial for the substrate is communicated to the controller. The controller is programmed to establish an expected location of the fiducial F with respect to the end effector, when the substrate 215 is transported by the robot end effector 195, from the fiducial position information provided by the aligner. The expected fiducial location on the end effector may be used by the controller 170, as will be described below to effect on the fly centering with system 101, using for example sensor(s) 199 identifying at least two points on the substrate or with but one sensor 199 for on-the-fly wafer detection.

In this exemplary embodiment, aligner 162 may be capable of sensing, and hence generating metric data regarding the substrate diameter. The aligner, in the exemplary embodiment may, in combination with controller 170, be capable of measuring substrate diameter, mapping circularity and concentricity of the substrate perimeter and of identifying any defects or variance in the substrate perimeter edge. For example, the aligner sensing device may be (for example a linear or arrayed sensing device) capable of sensing position of the substrate perimeter substantially around as the substrate perimeter edge. The perimeter position data from aligner 162 may be sent to and registered with controller 170. In the exemplary embodiment, the controller may have program 173 to determine the substrate diameter from the data. The controller may register the substrate diameter and fiducial location information for each substrate to be subject to on the fly centering with system 101. In alternate embodiments, the substrate diameter information may be provided and registered in the controller by any other suitable means. In the exemplary embodiment, the program 173 of controller 170 may be capable of determining other geometric information of the substrate from the perimeter position data transmitted by the aligner 162. For example controller 170 may be capable of calculating the substrate center and of mapping the relative radius between center and substrate perimeter around the circumference of the substrate. For example, a substrate may not be perfectly circular and may be somewhat out of round (see for example FIG. 5). The out of round perimeter PE information may be sensed by the aligner and communicated to the processor of controller 170, which may employ suitable arithmetic techniques to determine a center of the out of round substrate. Conversely, the radius (i.e. the distance between substrate center and perimeter) will vary in a sweep of the substrate circumference. The controller program 173, in the exemplary embodiment, may be capable of defining the radial variance around the circumference of the substrate and mapping it relative to a desired reference (e.g. fiducial F) of the substrate. The radial variance may be defined by the controller 170 in an algorithm form or tabular form and may be stored in the memory of the controller. Other geometric properties of the substrate may also be defined and stored in memory by controller 170, such as arc length AL (see FIG. 5) for desired off center distances and angular orientation, that may be correlated to substrate radius at a specific substrate perimeter location, and may be sensed by sensor(s) 199 of the centering system. Thus, as will be described further below, the controller 170 may be capable of determining (e.g. identifying from the radius mapping in its memory) the specific substrate radius to a point on the substrate perimeter from an arc length measurement taken at that point and from a known orientation of the substrate. In alternate embodiments, any other desired geometries of the substrate may be used for radius determination of the substrate during centering.

In accordance with another exemplary embodiment, the fiducial and substrate diameter information may be communicated to the controller by the reader 302 of the substrate variance determination system 300. For example, substrate diameter information may be observed in advance (for example at a remote location prior to the subject arriving at the process apparatus 100) and may be tagged to the corresponding substrates (such as by readable indicia 215I positioned on the substrate or substrate carrier as described before) for reading and registration by the controller. In alternate embodiments, the substrate metric information may be stored in any suitable memory outside of controller 170, and accessed by the controller as desired.

In the exemplary embodiment, and as noted before, the controller 170 may be programmed to monitor and register various ephemeris data of the apparatus and substrate, to be used by the centering system 101 as described further below. As may be realized, dimensional characteristics of the substrate may vary with environmental conditions, especially temperature. For example, the substrate 215 may undergo thermal expansion and contraction as it is subjected to temperature variations during processing. The controller 170 may have information regarding the prior location of the substrate, and of the environmental temperature to which the substrate may have been subjected in its prior location, as well as time of exposure and any other relevant information. For example, the substrate may have been removed at some prior time from a baking module placed in a transport container at some temperature and held there for a period of time, and then loaded into apparatus 100 having a certain front end temperature. The controller memory may thus hold data regarding temperatures in various regions of the apparatus 100 through which the substrates 215 may be transported or in which the substrate was held as well as other desired portions of the FAB. For example, temperature information may be stored in the controller 170 for the transport containers (not shown) in which the substrates are transported to the apparatus. Temperature information may be stored for the front section 105

(see FIG. 1), load locks and any buffer stations (not shown) where the substrates may be buffered. Similarly in the vacuum section 110, thermal information, such as temperatures of radiating surfaces or thermally absorbing surfaces (e.g. heating plates, cooling plates, etc.) may also be stored with controller 170 as may be realized, in the exemplary embodiment, the controller 170 may also monitor and store temporal information of the substrate, such as location and time. Thus the controller 170, in the exemplary embodiment may have in its memory data for desired parameters to sufficiently define the thermal condition of the substrate in a desired period of time, such as when passing by sensor(s) 197-199. For example, the controller may have a suitable thermal balance algorithm to suitably establish the thermal condition (i.e. temperature) of the substrate at a given time such as at measurement of the radius by aligner 162 and when passing sensor(s) 199. In alternate embodiments, the data for identifying the thermal condition for the substrate may be accessed by the controller from a desired outside memory location. In still other alternate embodiments, the thermal condition of the substrate may be directly measured by a suitable device such as an optical thermometer. Data on the temperature of the wafer may be communicated to the controller for use to determine dimensional variance due to thermal condition as will be described below.

Still referring to FIG. 2, the sensor(s) 199 may be of any suitable type, such as a through beam or reflectance sensor, capable of detecting the presence of the substrate 215 as the substrate is moved past the sensor by robot 130. In the exemplary embodiment, sensor 199 may have a beam source 199S and detector 199D that generates an appropriate signal when it detects or fails to detect the beam. The sensor 199 may be located offset with respect to the transport path P of the substrate, so that the substrate edge passes through the sensing area of sensor 199. The transport path of the substrate is shown in FIG. 2 as a substantially radial path (i.e. the path extends through the shoulder axis Z of robot 130) for example purposes. In alternate embodiments the substrate may have any desired transport path. For example, the path may be a rectilinear path offset but substantially parallel to the radial path. In other alternate embodiments, the path may be offset and at a desired angle relative to the radial. The sensor 199 may be optimally located for improved sensitivity for detecting the subject edge as described in U.S. patent application Ser. No. 10/739,375 previously incorporated by reference herein.

In the exemplary embodiment, the location of the sensor 199 relative to the transport path may be based on the expected orientation of the substrate 215 (i.e. on the expected position of the fiducial) on the end effector, and hence on the substrate orientation parameters associated with the processing module 125 to which the substrate is to be transported. By way of example, the sensor 199 may have a sensing region, that may be substantially a spot for a through beam sensor with a columnated beam, which may be considered to define an exclusion zone E (see FIG. 3a) for the fiducial F on the substrate 215. The anticipated orientation of the substrates being transported to a given processing module is determinable at set up of the apparatus when the processing modules and robots are being installed. The on-the-fly centering sensor 199, may be accordingly positioned with respect to the transport path to ensure that under the expected substrate orientation on the robot end effector, dependent on the orientation parameters associated with the given processing modules, the fiducial F is not expected within the exclusion zone of the sensor.

Figure 3A:
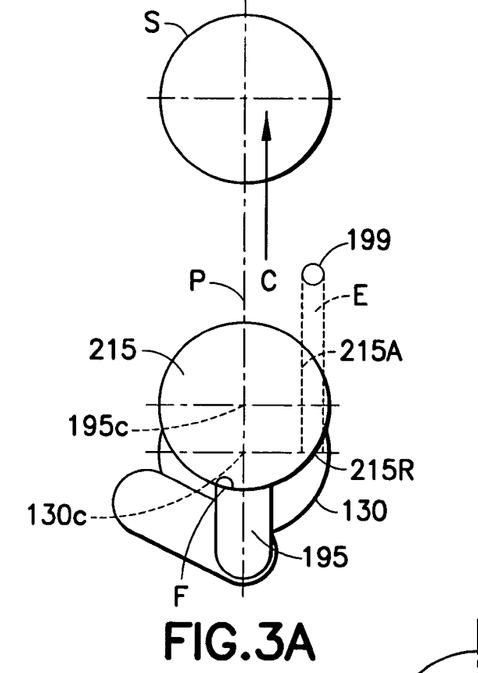
FIGS. 3A-3C are plans views of the substrate transport apparatus and sensor showing the transport apparatus respectively in different positions.
Figure 3B:
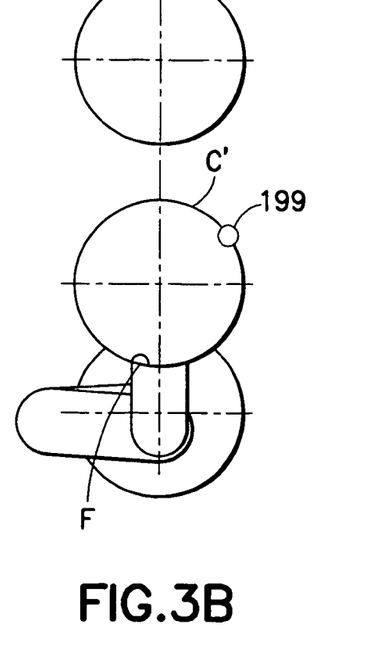
Figure 3C:
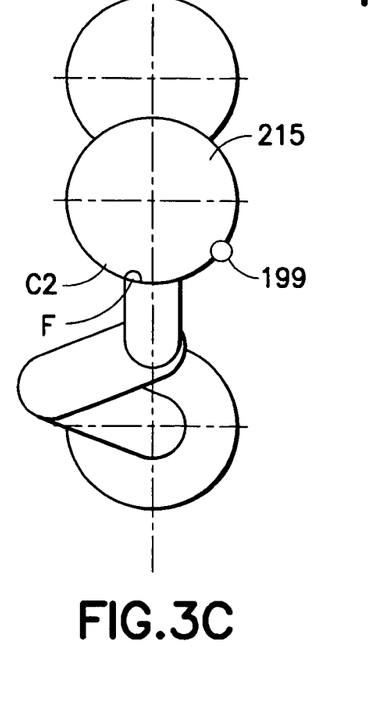

FIGS. 3A-3C show the robot 130 in three respective positions as it transports substrate 215 along a substantial radial path to substrate station S. In positions $C_1$, $C_2$, shown in FIGS. 3b-3c, the substrate 215 is in position in which the sensor 199 senses respectively the leading and trailing portions of the peripheral edge of the subject 215. The robot positional data, (in particular position of the center of end effector Rc determined by the controller as noted before) is registered upon receiving the signal from the sensor 199 that the substrate is in position C1 and in position C2. This positional information may be used as described further below to determine the centering distance. As may be realized, as the signals from sensor 199 of positions C1, C2 are generated as the substrate is on the fly, compensation for signal delays may be employed by controller 170 as described in U.S. patent application Ser. No. 10/739,375. Thus, the controller 170 may reconstruct end effector positions readings with the aforementioned delay compensation technique and convert the position into points on the substrate perimeter which in turn are used as noted below.

Figure 4:
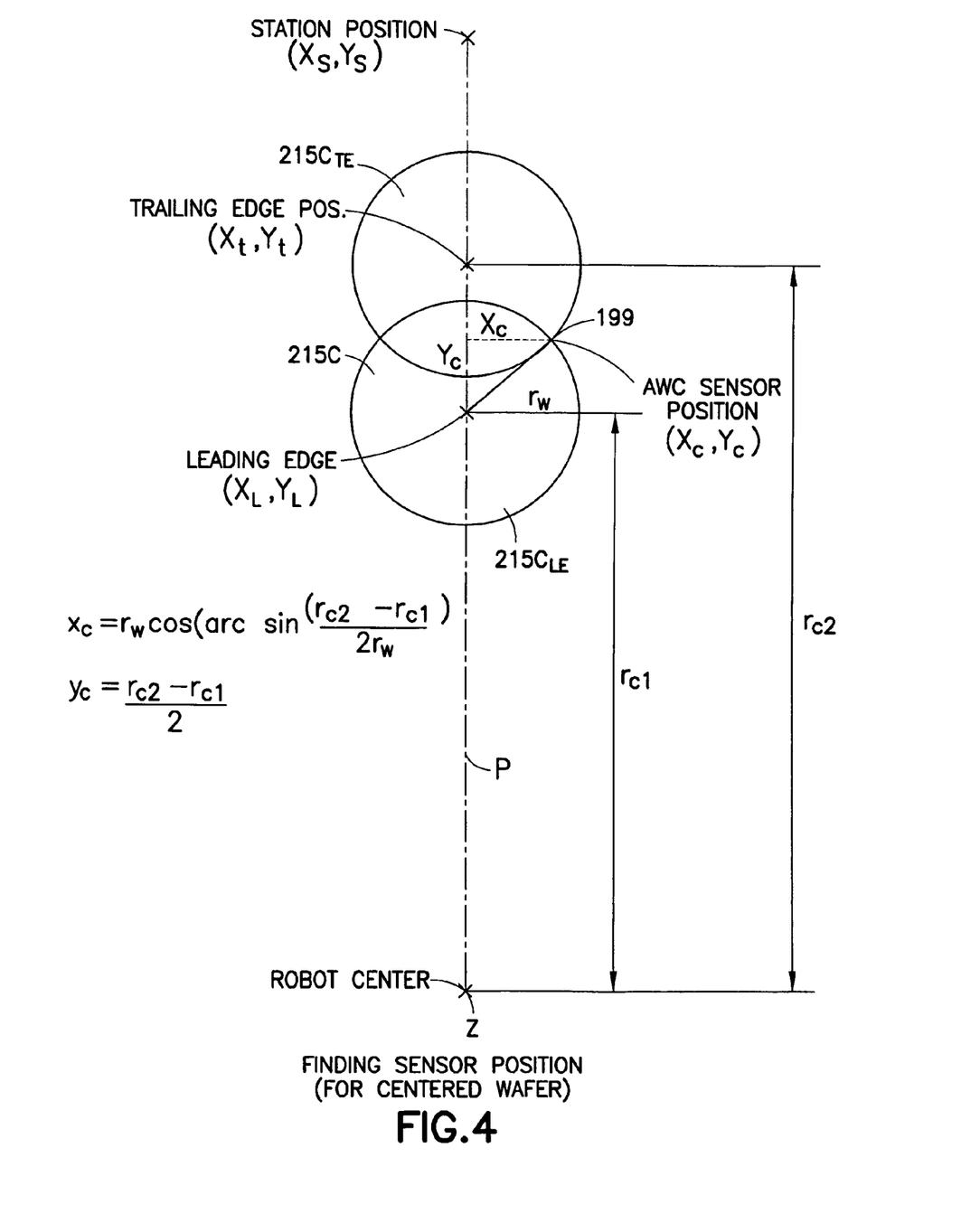
FIG. 4 is a diagram depicting reference locations of the transport apparatus, substrate station, sensor and calibrating substrate in different positions, and illustrating the determination of the sensor position.

Referring now to FIG. 4, in the exemplary embodiment, the centering process programmed in controller 170 may calibrate, the location of the sensor(s) 199 relative to the robot reference frame. This is illustrated diagrammatically in FIG. 4. To calibrate the location of sensor 199 a calibration substrate 215C of known size (as noted before the controller knows the size of each substrate to a degree of accuracy sufficient for the desired accuracy of the on-the-fly centering determination) may be positioned with the substrate center substantially coincident with a desired reference position on the end effector center Rc. In alternate embodiments, any desired reference such as position on the transport robot may be used. As may be realized, the precise positioning of the desired reference point, on the transport robot, within the robot reference frame may be established, for example using suitable robot teaching systems, in order to facilitate calibration of the sensor position.

The symbols used in the equations provided below are defined in Table 1 below:

TABLE 1

| WAFER CENTER ALGORITHM DEFINITIONS | | |
|---|---|---|
| $r_w$ | WAFER RADIUS | (m) |
| $r_{c1}$ | r-position of end effector when sensor detects leading edge of substrate during calibration | (m) |
| $r_{c2}$ | r-position of end effector when sensor detects trailing edge of substrate during calibration | (m) |
| $X_c$ | Distance from wafer center to edge sensor in x-direction found during calibration | (m) |
| $Y_c$ | Distance from wafer center to edge sensor in x-direction found during calibration | (m) |
| $r_{m1}$ | r-position of end effector when sensor detects leading edge of substrate | (m) |
| $r_{m2}$ | r-position of end effector when sensor detects trailing edge of substrate | (m) |
| $X_m$ | Distance from wafer center to edge sensor in x-direction | (m) |
| $Y_m$ | Distance from wafer center to edge sensor in x-direction | (m) |
| $\Delta_x$ | Difference between the measured and calibrated wafers in the x-direction | (m) |
| $\Delta_y$ | Different between the measured and calibrated wafers in the y-direction | (m) |
| $\Delta_T$ | Adjustment required to place measured wafer on center at station position in theta coord | (rad) |

TABLE 1-continued

WAFER CENTER ALGORITHM DEFINITIONS

| $\Delta_R$ | Adjustment required to place measured wafer on center at station position in R coord | (m) |
|---|---|---|

The controller 170 is programmed for example as part of wafer centering program 178 (see FIG. 1) with calibration algorithm defined for example by equations (1) & (2) shown below:

$$X_c = r_w \cos\left(\arcsin\left(\frac{r_{c2} - r_{c1}}{2r_w}\right)\right) \quad (1)$$

$$Y_c = \frac{r_{c2} - r_{c1}}{2} \quad (2)$$

In FIG. 4, the calibration substrate is shown in two positions 215C$_{TE}$ and 215C$_{LE}$, in which the sensor 199 respectively senses the trailing and leading edges of the calibration substrate perimeter. The calibration algorithm (1-2) allows the controller 170 to determine the sensor coordinates $X_c$, $Y_c$ (in this example Cartesian coordinates are used, though the controller may be programmed with suitable equations to define the location of the sensor in any desired spatial coordinate system). As noted above, the $r_w$, $r_{c2}$, and $V_{c1}$ values are registered by controller 170, and subsequent to the determination, the coordinates ($X_c$, $Y_c$) for the sensor may also be stored in controller 170. The value $r_w$ in equations 1-2, is the known radius of the calibration wafer. As may be realized, calibration of the sensor position may be performed at any desired time, such as at set up of the processing apparatus. The calibration wafer radius $r_w$ may thus be accurately measured within a sufficiently short period of time prior to performing the calibration procedure so that dimensional variation due to thermal effects are negligible and no compensation for such effects are needed. Nevertheless, in the event that calibration may occur with the apparatus having a substantially different thermal environment than on measurement of the calibration substrate 215C radius, the change in the radius value $r_w$ due to thermal effects may be established in a manner similar to the operative substrates described below. As may also be realized, the calibration algorithms set forth in equations 1-2 above, as well the other equations of wafer centering algorithm described below are expressed for a radial transport path P in the exemplary embodiment shown in FIG. 4. In alternate embodiments, where the path, as noted before, may not be radial, the calibration algorithms (1-2), and other centering algorithms may be suitably modified to accommodate the geometries of the paths. For example, for offset but generally parallel transport path to radial path P, the algorithms may be generally similar in form to the calibration and centering algorithms but may for example incorporate a known constant value accounting for the offset of the parallel transport paths. Thus equations 1-2 may be more generally expressed:

$$X_c = V_w \cos\left(\arcsin\left(\frac{y_{c2} - y_{c1}}{2r_w}\right)\right) + k_o \quad (1')$$

$$Y_c = \frac{y_{c2} - y_{c1}}{2} \quad (2')$$

where: $y_{c2} = r_{c2} \sin c$ $$\left(\arccos\frac{x_o}{r_{c2}}\right)$$

and $$y_{c1} = r_{c1} \sin\left(\arccos\frac{x_0}{r_{c1}}\right)$$

where $x_0$ is the path offset value (in cartesian coordinates) from the radial path.

In alternate embodiments, the equations may be modified accordingly for any linear path geometry.

Figure 5:
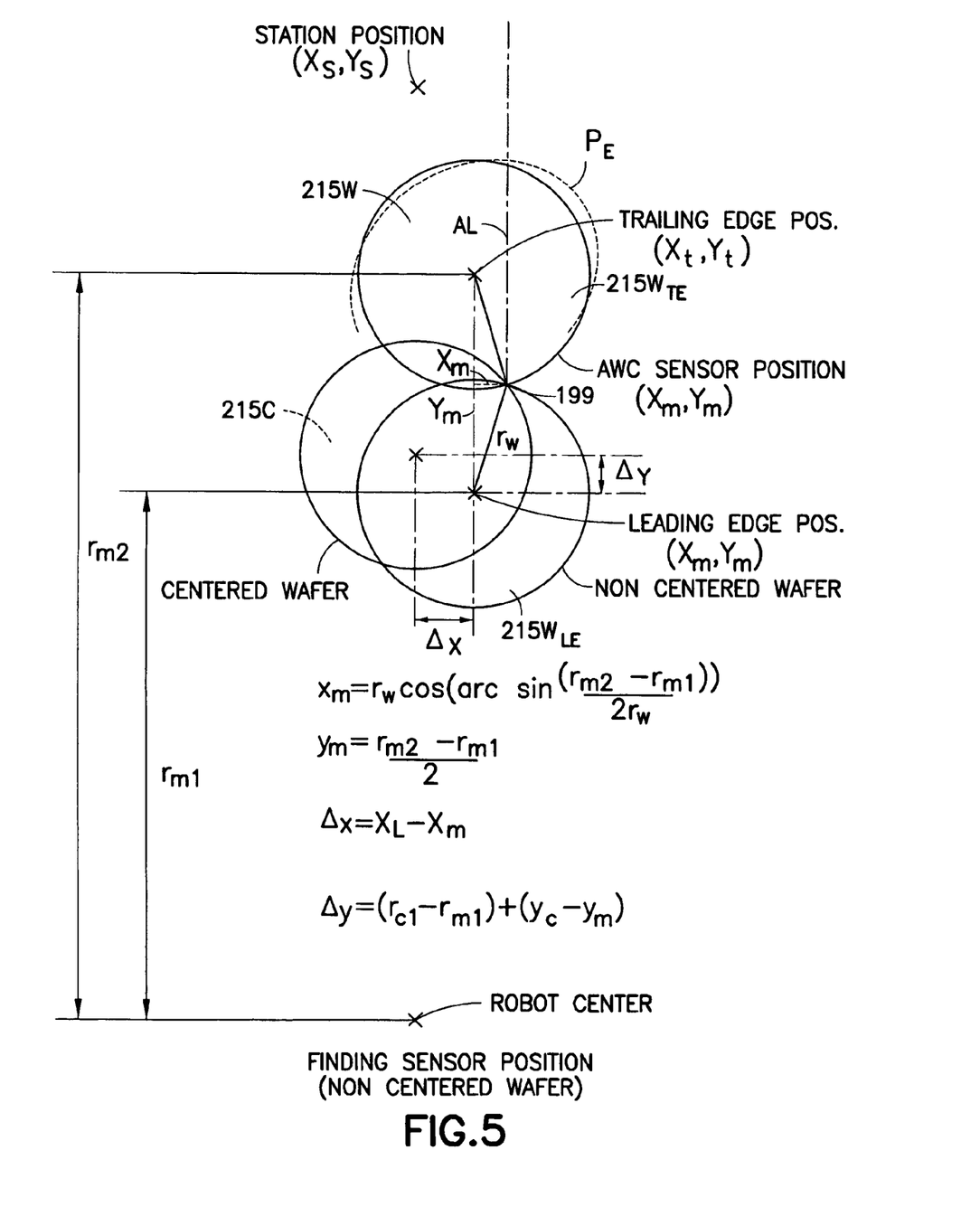
FIG. 5 is another diagram depicting reference locations of the transport apparatus, substrate station, sensor and production substrate in different positions, and illustrating the determination of the production substrate position.

FIG. 5 diagrammatically depicts a substrate (such as a production substrate) subject to on the fly centering in positions 215w$_{le}$, 215W$_{te}$ (similar to C1, C2 shown in FIGS. 3b-3C) in which the robot radial positions $r_{w1}$, $r_{w2}$ are captured by the controller 170 when the sensor 199 senses the leading and trailing edges of the substrate as described before. Controller 170 is programmed with wafer centering algorithm defined for example by equations (3)-(8) noted below:

$$X_m = r_w \cos\left(\arcsin\left(\frac{r_{m2} - r_{m1}}{2r_w}\right)\right) \quad (3)$$

$$Y_m = \frac{r_{m2} - r_{m1}}{2} \quad (4)$$

$$\Delta X = X_c - X_m \quad (5)$$

$$\Delta y = (r_{c1} - r_{m1}) + (y_c - y_m) \quad (6)$$

$$\Delta T = \frac{-\Delta X}{R_s + \Delta_y} \quad (7)$$

$$\Delta R = \frac{-\Delta y}{\cos(\Delta T)} \quad (8)$$

Equations (3)-(6) enable the controller to determine the eccentricity ($\Delta x$, $\Delta y$) of the wafer with respect to end effector center in the exemplary embodiment. The values for $r_w$, $r_{m2}$, $r_{m1}$ are registered by controller 170 in a manner similar to that noted before. Further controller 170 may with suitable algorithms, databases, tables, compensate for variances in the diameter (i.e. $r_w$) of the substrate. By way of example, the controller may access the radius mapping information registered in memory as noted before to establish the mapper radius value to the edge locations identified by the sensor. For example, and as also noted before, the radius $r_w$ may be obtained by correlation to measured arc length (e.g. $r_{m2}-r_{m1}$) cross referenced with orientation of the substrate. By way of further example, controller 170 may be programmed with a suitable algorithm to account for and compensate for environmental induced variance, such as thermal expansion due process temperatures. In the exemplary embodiment, the value of $r_w$ applied in the algorithm by controller 170 represents a substantially true value of the radius of the production wafer. The diameter compensation algorithm may be employed by the controller subject to enablement devices. For example, the diameter compensation algorithm may be initiated by controller 170 based on substrate origin and/or substrate destination. The controller 170 may also be programmed with suitable data, or range of acceptable measurements in order to determine if a position signal from the sensor indicates a perimeter position out of the desired statistical range. This may be used to indicate to the controller, that the fiducial may have been inadvertently located in the exclusion zone, or that the substrate has a defect (such as may be caused by breakage). In the event that the controller finds the perimeter position out of the desired range, the controller may automatically commence calculation to determine if the fiducial, in the moves performed on substrate, may have been positioned in the exclusion zone E (see FIG. 3A). If the controllers determines that the substrate orientation positions the fiducial in the exclusion zone E (see FIG. 3A) the controller may reconfigure the transport path so that the fiducial avoids the exclusion zone. The controller may also be programmed to send a suitable alert to the operator to indicate the out of range condition if for example, the controller determines the fiducial was outside the exclusion zone during transport. In alternate embodiments, the controller may be programmed to send the alert prior to attempting automatic corrective action. Thus, the centering system and programming may be used to prevent or detect substrate breakage.

Figure 6:
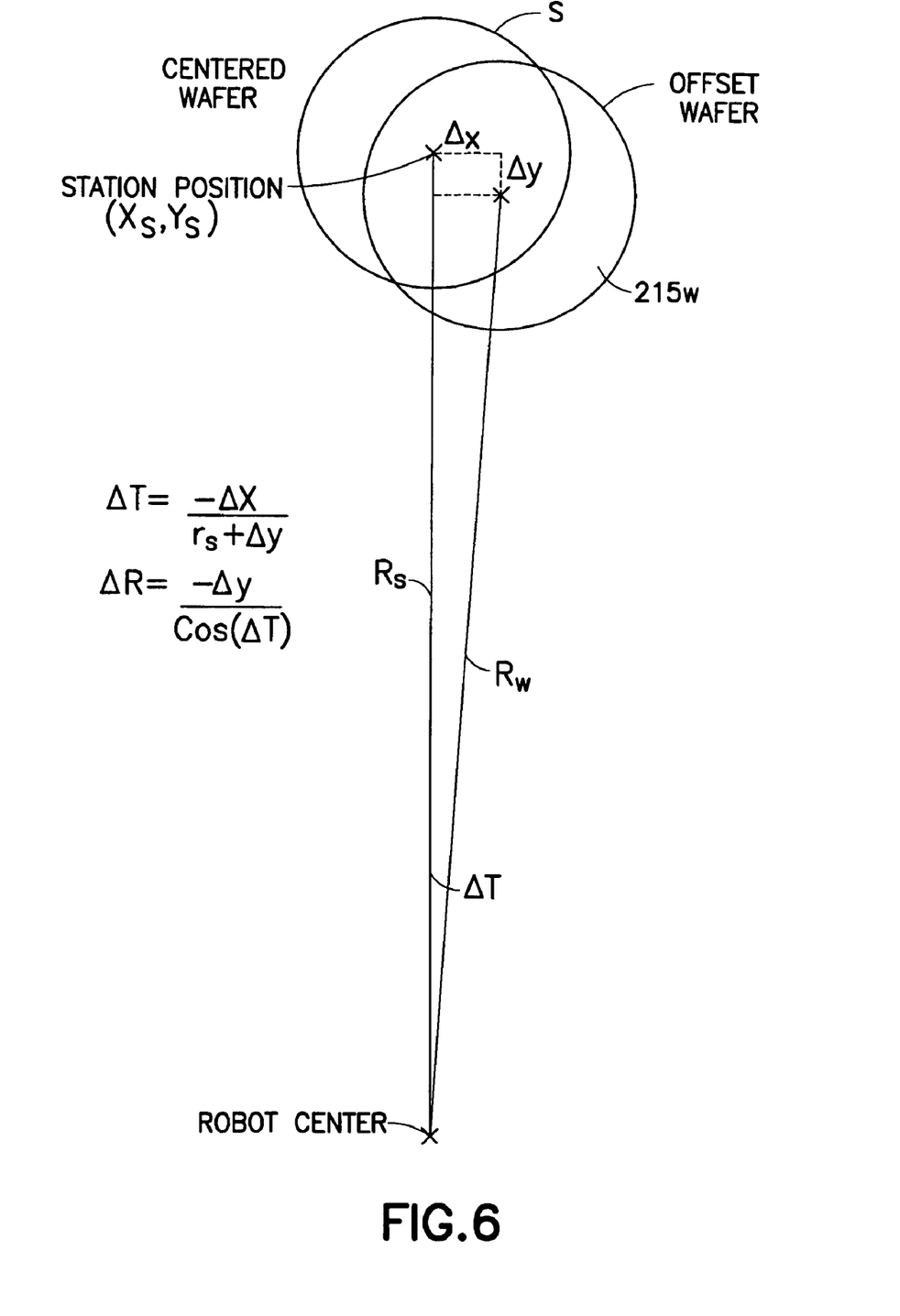
FIG. 6 is still another diagram depicting reference locations of the transport apparatus, determined offset substrate position and centered substrate positions at the station, for illustrating the determination of the centering correction factors for the transport apparatus.

Upon determining the eccentricity of the substrate (in the exemplary embodiment relative to end effector center) the controller algorithm generates, with equations (7)-(8), the robot motion values ($\Delta R$, $\Delta T$) shown in FIG. 6, to locate the substrate in the center SC of substrate station (term Rs represents the radial position of the station center see also FIG. 2) SS. The robot motion values may be formatted into suitable kinematic commands for generating the desired robot motion.

Thus, the wafer center position, in the exemplary embodiment, may be repeatably determined without substantial difference for any number of wafers and regardless of dimensional variation between wafers using if desired a single sensor 199 which that may be tied into the robots hi-speed I/O. When the wafer interrupts the sensor the robot encoder position may be latched and stored. The algorithm may use two captured measurements to calculate the wafer center. These values may be compared to values stored during a calibration which runs the robot through its trajectory with a calibration wafer centered on the end effector. The difference of these values may be used to calculate the wafer x and y offsets which in turn will be transformed to robot coordinates for placement compensation.

In the exemplary embodiment the AWC algorithm depends on measured wafer diameter registered in the controller to calculate the wafer offsets. In alternate embodiments, the wafer diameter value may will be set in the algorithm initially to the nominal diameter of the substrate being measured. If the actual substrate diameter varies from the nominal beyond a desired range (corresponding for example to the desired placement tolerance at the processing station) the actual value replaces the nominal value. To counteract diameter variation due to environmental factors the proposed algorithm may use environment factors to the known data about the substrate diameter to compensate for environment induced variations. Knowledge about actual substrate diameters in the exemplary embodiment may be gained by passing information from a substrate aligner 162 that can measure the wafer diameter to controller. Known data about wafer and process temperatures thus may be used to compensate for diameter variations due to thermal growth.

As noted before, the AWC algorithm has knowledge of the fiducial position relative to a defined sensor exclusion zone. In an exemplary embodiment, this zone may be determined based on the sensor location relative to the substrate motion path. Additionally when the notch is in the range, statistics and data about eccentricity calculations can be used to make adjustments and alert user of potential placement problems. This same method can be used to prevent or detect substrate breakage. Information about the fiducial location may be known from feedback from the substrate aligner.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus comprising:
    a transport apparatus adapted for transporting a substrate between processing stations of the processing apparatus;
    at least one sensor connected to the transport apparatus and capable of sensing the substrate transported by the transport apparatus, the at least one sensor being arranged for sending at least one signal in response to sensing the substrate; and
    a controller communicably connected to the sensor and arranged to determine alignment of the substrate in at least two directions, disposed in a plane of the substrate and angled relative to each other, relative to a predetermined location from the at least one signal identifying no more than two points on the substrate and independent of radial variances between substrates.

2. The apparatus according to claim 1, wherein the at least one sensor comprises a beam source and a beam detector.

3. The apparatus according to claim 2, wherein the at least one sensor is a through-beam sensor.

4. The apparatus according to claim 2, wherein the sensor is a reflectance sensor.

5. The apparatus according to claim 1, wherein the controller is programmed to transport the substrate, with the transport apparatus, along a linear path, and the at least one signal is in response to the at least one sensor sensing the substrate transported on the linear path.

6. The apparatus according to claim 5, wherein the linear path extends substantially through a pivot axis on which the transport apparatus is capable of pivoting as a unit.

7. The apparatus according to claim 5, wherein the linear path is offset a distance from a pivot axis on which the transport apparatus is capable of pivoting as a unit.

8. The apparatus according to claim 1, further comprising at least another sensor, different from the at least one sensor, and connected to the controller for measuring a predetermined characteristic of the substrate, when the substrate is not transported with the transport apparatus, and wherein the controller is further arranged to determine the alignment of the substrate using the at least one signal and the measurement of the predetermined characteristic.

9. The apparatus according to claim 8, wherein the at least other sensor is a substrate aligner.

10. The apparatus according to claim 8, wherein the at least other sensor is separated from the at least one sensor by a partition of the processing apparatus.

* * * * *